United States Patent
Chiang et al.

(10) Patent No.: US 10,235,862 B2
(45) Date of Patent: Mar. 19, 2019

(54) ELECTRONIC APPARATUS AND TEST METHOD

(71) Applicants: Inventec (Pudong) Technology Corporation, Shanghai (CN); INVENTEC CORPORATION, Taipei (TW)

(72) Inventors: Sheng-Han Chiang, Taipei (TW); Feng-Shan Chen, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 98 days.

(21) Appl. No.: 15/479,261

(22) Filed: Apr. 4, 2017

(65) Prior Publication Data

US 2018/0144604 A1 May 24, 2018

(30) Foreign Application Priority Data

Nov. 22, 2016 (CN) .......................... 2016 1 1041039

(51) Int. Cl.
| | |
|---|---|
| *G06F 11/30* | (2006.01) |
| *G08B 21/18* | (2006.01) |
| *G01R 31/36* | (2019.01) |
| *H02J 7/00* | (2006.01) |

(52) U.S. Cl.
CPC ....... *G08B 21/185* (2013.01); *G01R 31/3627* (2013.01); *G01R 31/3682* (2013.01); *G01R 31/3693* (2013.01); *H02J 7/0021* (2013.01); *G01R 31/3672* (2013.01)

(58) Field of Classification Search
CPC .................................................. G08B 21/185
See application file for complete search history.

(56) References Cited

U.S. PATENT DOCUMENTS

2013/0097452 A1* 4/2013 Cheng .................. G06F 1/14
713/500

FOREIGN PATENT DOCUMENTS

| CN | 1936850 | * | 3/2007 |
|---|---|---|---|
| CN | 1936850 A | | 3/2007 |
| TW | 200521462 A | | 7/2005 |
| TW | 201348726 A | | 12/2013 |

* cited by examiner

*Primary Examiner* — Phuong Huynh
(74) *Attorney, Agent, or Firm* — CKC & Partners Co., LLC

(57) ABSTRACT

An electronic apparatus includes a motherboard, a random access memory, a motherboard battery and a processing unit. The random access memory is disposed on the motherboard. The motherboard battery is disposed on the motherboard and electrically coupled to the random access memory to supply electrical power to the random access memory. The processing unit is disposed on the motherboard and electrically coupled to the random access memory. The processing unit is configured to write a test value into an idle address register of the random access memory and further to check whether the idle address register maintains the test value. When the idle address register maintains the test value, the processing unit determines that the motherboard battery functions normally. When the idle address register reverts to an initial value, the processing unit determines that the motherboard battery malfunctions.

8 Claims, 3 Drawing Sheets

300

| 0  | 00       | 01       | 02          | 03       |   | N        |
|----|----------|----------|-------------|----------|---|----------|
| 00 | $A_{00}$ | $A_{01}$ | $A_{02}$    | $A_{03}$ |   | $A_{0N}$ |
| 10 | $A_{10}$ | $A_{11}$ | $A_{12}$    | $A_{13}$ |   | $A_{1N}$ |
| 20 | $A_{20}$ | $A_{21}$ | $A_{22}(00)$| $A_{23}$ |   | $A_{2N}$ |
| 30 | $A_{30}$ | $A_{31}$ | $A_{32}$    | $A_{33}$ |   | $A_{3N}$ |
| M  | $A_{M0}$ | $A_{M1}$ | $A_{M2}$    | $A_{M3}$ |   | $A_{MN}$ |

| 0  | 00       | 01       | 02          | 03       |   | N        |
|----|----------|----------|-------------|----------|---|----------|
| 00 | $A_{00}$ | $A_{01}$ | $A_{02}$    | $A_{03}$ |   | $A_{0N}$ |
| 10 | $A_{10}$ | $A_{11}$ | $A_{12}$    | $A_{13}$ |   | $A_{1N}$ |
| 20 | $A_{20}$ | $A_{21}$ | $A_{22}(x)$ | $A_{23}$ |   | $A_{2N}$ |
| 30 | $A_{30}$ | $A_{31}$ | $A_{32}$    | $A_{33}$ |   | $A_{3N}$ |
| M  | $A_{M0}$ | $A_{M1}$ | $A_{M2}$    | $A_{M3}$ |   | $A_{MN}$ |

C1

Fig. 3B

ELECTRONIC APPARATUS AND TEST METHOD

RELATED APPLICATIONS

This application claims priority to Chinese Application Serial Number 201611041039.3 filed Nov. 22, 2016, which is herein incorporated by reference.

BACKGROUND

Technical Field

The present disclosure relates to an electronic apparatus. More particularly, the present disclosure relates to a test technology for a motherboard battery of the electronic apparatus.

Description of Related Art

Generally, a motherboard of a computer requires a motherboard battery, in which the motherboard battery may be a Lithium (Li) battery which is used to supply electrical power to a real-time clock (RTC) chip and/or a CMOS random access memory (RAM), for example. In a conventional computer manufacturing process, a test of the motherboard battery is operated by a manual operation with a multimeter. However, the manual operation may involve human errors resulting in problems that cannot be found in time. Moreover, the conventional test cannot detect whether the entire power supply path has another problem.

Further, the conventional test determines whether the motherboard battery functions normally according to a real-time clock function provided by the real-time clock chip. Because the real-time dock chip is operated with the power supplied by the motherboard battery, when the motherboard battery has run out, the real-time clock will revert to a default value (e.g., 2010/1/1). A system dock has a characteristic of being auto adjusted to conform to the real-time dock of the motherboard. Thus, when the system clock reverts to the default value, a user may know that the motherboard battery fails to supply power normally (i.e., the motherboard battery runs out or malfunctions).

However, in a version of Microsoft operating system windows 8 or later, the system date/clock will be auto revised or re-record the real-time clock of the motherboard for synchronization. For example, when the system time lags behind the motherboard time, the system will revise the real-time clock of the motherboard; and when the system time is ahead of the motherboard time, the system re-record the real-time dock of the motherboard. Hence the conventional testing method is no longer applicable to determining whether the motherboard battery functions normally.

SUMMARY

An aspect of the present disclosure is to provide a method for testing a motherboard battery of an electronic apparatus. The method includes writing a test value into an idle address register of a random access memory of the electronic apparatus, in which the motherboard battery is used to supply electrical power to the random access memory; checking whether the idle address register maintains the test value; when the idle address register maintains the test value determining that the motherboard battery functions normally; and when the idle address register reverts to an initial value, determining that the motherboard battery malfunctions.

Another aspect of the present disclosure is to provide an electronic apparatus. The electronic apparatus includes a motherboard, a random access memory, a motherboard battery and a processing unit. The random access memory is disposed on the motherboard. The motherboard battery is disposed on the motherboard and electrically coupled to the random access memory to supply electrical power to the random access memory. The processing unit is disposed on the motherboard and electrically coupled to the random access memory. The processing unit is configured to write a test value into an idle address register of the random access memory and further to check whether the idle address register maintains the test value. When the idle address register maintains the test value, the processing unit determine that the motherboard battery functions normally. When the idle address register reverts to an, initial value, the processing unit determines that the motherboard battery malfunctions.

The present disclosure determines whether the motherboard battery functions normally by a volatile property of the random access memory, and thus no manual testing is needed to minimize the possibility of human errors. Also, the present disclosure is applicable to an operating system with the version of windows 8 or later.

BRIEF DESCRIPTION OF THE DRAWINGS

FIGS. 3A-3B are schematic diagrams showing a memory data area according to an embodiment of this disclosure.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention.

In the specification, when a unit is referred to "connected" or "coupled", it means "electrically connected" or "electrically coupled". Terms of "connected" and "coupled" may also represent interactions between two of more units.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
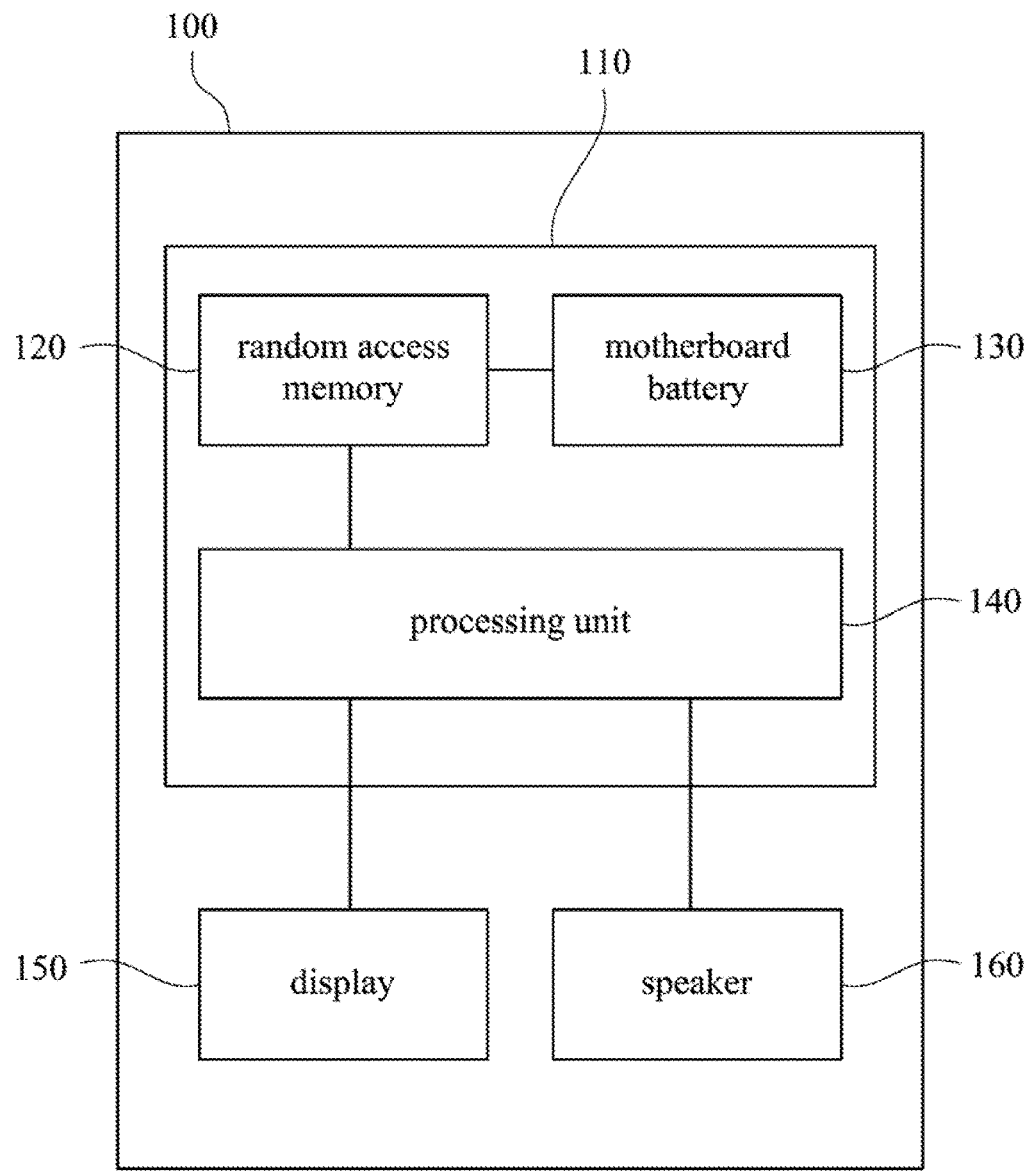
FIG. 1 is a schematic diagram of an electronic apparatus according to an embodiment of this disclosure.

Reference is made to FIG. 1. FIG. 1 depicts a schematic diagram of an electronic apparatus 100 according to an embodiment of this disclosure. The electronic apparatus 100 may be, for example, a desktop computer, and includes a motherboard 110, a random access memory 120, a motherboard battery 130, a processing unit 140, a display 150 and a speaker 160. The random access memory 120 the motherboard battery 130 and the processing unit 140 are installed on the motherboard 110. The processing unit 140 is, for example, a central processing unit (CPU), a system on chip (SoC) or any component that has computer processing function. The processing unit 140 is electrically coupled to the random access memory 120, the display 150 and the speaker 160 respectively, and can access or control the random access memory 120, the display 150 and the speaker 160. In detail the processing unit 140 can read data from the random access memory 120 or write data into the random access memory 120. The processing unit 140 can also control the display 150 to output images and control the speaker 160 to generate sounds.

In one embodiment, the random access memory 20 is a complementary metal oxide semiconductor random access memory (CMOS RAM) which is co-installed with a basic input/output system (BIOS) in a computer. The CMOS RAM can store a setting (such as a user login data or a system environmental setting) of the BIOS of the electronic apparatus 100. It should be noted that the random access memory 120 is a volatile memory. That is, When the random access memory 120 has no power, all the data stored in the random access memory 120 will disappear. Hence, the random access memory 120 has to be electrically coupled to the motherboard battery 130, so as to maintain the power supply for the random access memory 120. Even though the electronic apparatus 100 is shut down or turned off, as long as the motherboard battery 130 provides the power normally, the random access memory 120 can keep maintaining its data.

In this example, because the random access memory 120 is the CMOS RAM of the computer and stores the setting of the BIOS, when the random access memory 120 fails to keep the data due to power off, the electronic apparatus 100 cannot work normally. Accordingly, the motherboard battery 130 is required to be tested so as to ensure to function normally and has enough electrical power. Besides when a transmission path of the electrical power between the motherboard battery 130 and the random access memory 120 malfunctions, the random access memory 120 cannot receive constant power supply, thus causing the data stored in the random access memory 120 to disappear.

Figure 2:
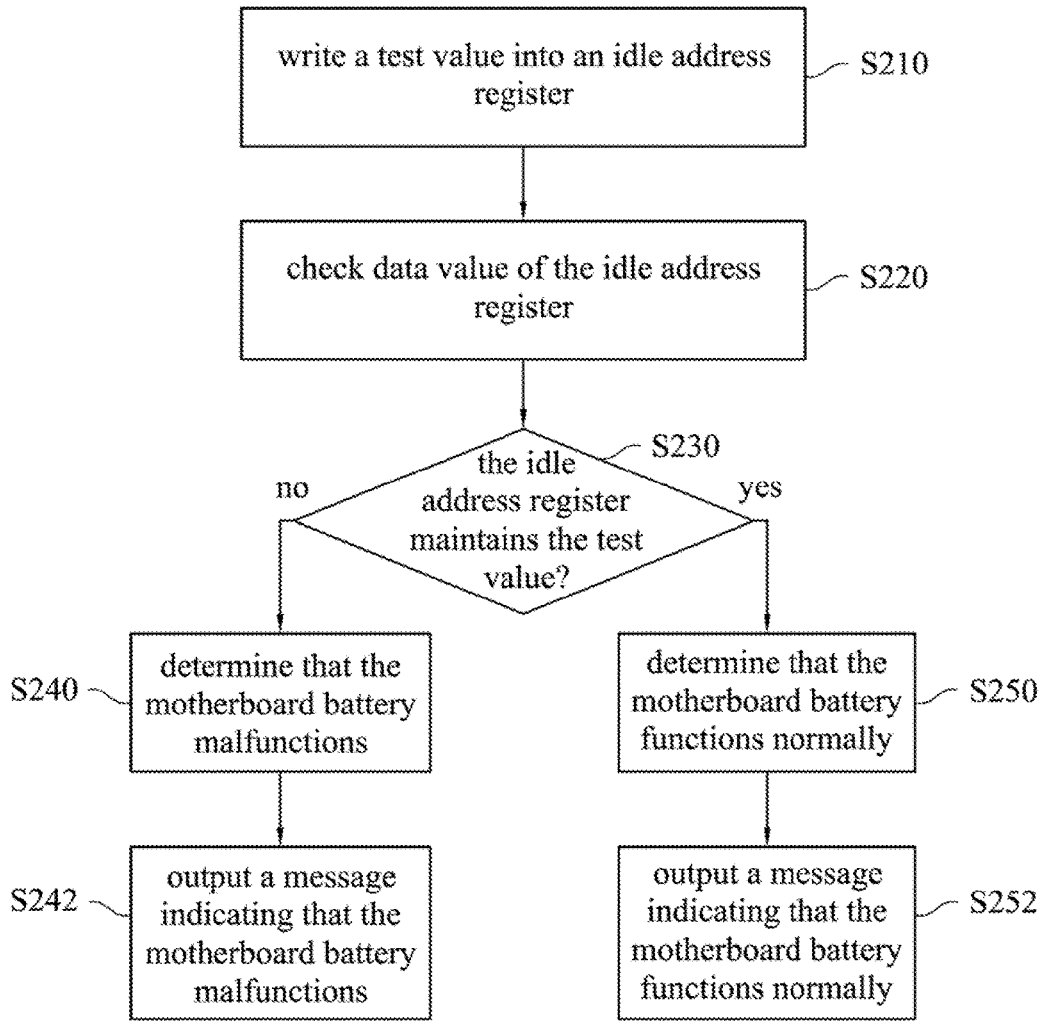
FIG. 2 is a flow chart of a test method according to an embodiment of this disclosure.

Reference is made to FIG. 2. FIG. 2 depicts a flow chart of a test method 200 according to an embodiment of this disclosure. The test method 200 is used to determine whether the motherboard battery 130 can supply power normally. The test method 200 determines a condition of the motherboard battery 130 based on the volatile property of the random access memory 120. That is, when the motherboard battery 130 functions normally, the random access memory 120 can maintain the data. On the contrary, when the motherboard battery 130 fails to function normally, the data of the random access memory 120 disappears.

Specifically, the test method 200 includes steps S210, S220 S230, S240, S242, S250 and S252. In step S210 in a manufacturing process of the random access memory 120 of the electronic apparatus 100, a test value is written into an idle address register of the random access memory 120 which is not occupied or used.

For example, refer to the schematic diagrams of a memory data area 300 of the random access memory 120 according to an embodiment of this disclosure depicted in FIGS. 3A and 3B. The memory data area 300 of the random access memory 120 includes plural address registers. For example, the memory data area 300 includes address registers disposed in an array, in which the memory data area 300 may be divided into N columns in a lateral direction, and divided into M rows in a longitudinal direction. That is, the memory data area 300 has M×N memory addresses, wherein both M and N are positive integers. An intersection region of interval row 00 of the longitudinal direction and column 00 of the lateral direction is an $A_{00}$ address, an intersection region of the row 00 of the longitudinal direction and column 01 of the lateral direction is an $A_{01}$ address, an intersection region of row 10 of the longitudinal direction and column 00 of the lateral direction is an $A_{10}$ address, and so on, such that an intersection region of row M of the longitudinal direction and column N of the lateral direction is an $A_{MN}$ address, as shown in FIG. 3A. That the random access memory 120 has M×N address registers in the memory data area 300.

In the embodiment of FIG. 3A, it is presumed that the memory data area 300 of the random access memory 120 has an idle address register C1 which is unoccupied. The so-called unoccupied idle address register C1 represents that the idle address register C1 does not store any data having practical significance or any effective value. In one embodiment, the unoccupied idle address register C1 has a default initial value. The idle address register C1 is at an $A_{22}$ address which is located at row 20 of the longitudinal direction and column 02 of the lateral direction. The default initial value of the idle address register C1 is "00". In step S210 of the test method 200, a test value "x" is written into the idle address register C1, as shown in FIG. 3B, in which the "x" can be any value except the initial value "00". For example, the test value "x" written into the idle address register C1 may be "33". Then, when the electronic apparatus 100 is assembled completely and the random access memory 120 is electrically connected to the motherboard battery 130, step S220 is performed. In step S220, the processing unit 140 checks the data value of the idle address register C1.

In step S230, if the processing unit 140 determines that the idle address register C1 fails to maintain the test value "x" but reverts to the initial value "00" (i.e., reverts to the data of FIG. 3A), it represents that the motherboard battery 130 fails to supply power normally. Then, the test method 200 enters step S240 to determine that the motherboard battery 130 malfunctions and further outputs a text, picture or video message via the display 150 of the electronic apparatus 100 or outputs a prompt sound via the speaker 160 of the electronic apparatus 100 to indicate that the motherboard battery 130 malfunctions in step S242.

Back to step S230, if the processing unit 140 determines that the idle address register C1 still maintain the test value "x", it represents that the motherboard battery 130 functions normally and the data of the idle address register C1 does not disappear. Then, the test method 200 enters step S250 to determine that the motherboard battery 130 functions normally and further outputs a text, picture or video message via the display 150 of the electronic apparatus 100 or outputs a prompt sound via the speaker 160 of the electronic apparatus 100 to indicate that the motherboard battery 130 functions normally in step S252.

It should be noted that the prompt message indicating that the motherboard battery 130 functions normally or malfunctions is not limited to outputting via the display 150 or the speaker 160, any corresponding change mechanism triggered according to a test result can be an alternate way.

With the aforementioned electronic apparatus 100 and the test method 200, the motherboard battery 130 no longer needs be tested by a manual operation with a multimeter. The system itself can show the condition of the motherboard battery 130. Accordingly, factors of misjudgment or negligence in operation which may occur in manual testing can be eliminated. Moreover, since the electronic apparatus 100 can self-test and auto display test results, labor costs can be saved and the testing process can be more precise and faster.

What is claimed is:

1. A method for testing a motherboard battery of an electronic apparatus, the method comprising:
    writing a test value into an idle address register of a random access memory of the electronic apparatus, wherein the motherboard battery is used to supply electrical power to the random access memory;
    checking whether the idle address register maintains the test value;
    when the idle address register maintains the test value, determining that the motherboard battery functions normally and outputting a message indicating that the motherboard battery functions normally; and
    when the idle address register reverts to an initial value, determining that the motherboard battery malfunctions.

2. The method according to claim 1, wherein the message indicating that the motherboard battery functions normally is an image message or a sound message.

3. The method according to claim 1, wherein when the idle address register reverts to the initial value, outputting a message indicating that the motherboard battery malfunctions.

4. The method according to claim 3, wherein the message indicating that the motherboard battery malfunctions is an image message or a sound message.

5. An electronic apparatus, comprising:
    a motherboard;
    a random access memory disposed on the motherboard;
    a motherboard battery disposed on the motherboard and electrically coupled to the random access memory to supply electrical power to the random access memory;
    a processing unit disposed on the motherboard and electrically coupled to the random access memory, wherein the processing unit is configured to write a test value into an idle address register of the random access memory and further to check whether the idle address register maintains the test value; and
    a display electrically coupled to the processing unit,
    wherein when the idle address register maintains the test value, the processing unit determines that the motherboard battery functions normally and controls the display to output an image message indicating that the motherboard battery functions normally; and
    wherein when the idle address register reverts to an initial value, the processing unit determines that the motherboard battery malfunctions.

6. The electronic apparatus according to claim 5, further comprising:
    a display electrically coupled to the processing unit, wherein when the idle address register reverts to the initial value, the processing unit controls the display to output an image message indicating that the motherboard battery malfunctions.

7. The electronic apparatus according to claim 5, further comprising:
    a speaker electrically coupled to the processing unit, wherein when the idle address register maintains the test value, the processing unit controls the speaker to output a prompt sound indicating that the motherboard battery functions normally.

8. The electronic apparatus according to claim 5, further comprising:
    a speaker electrically coupled to the processing unit, wherein when the idle address register reverts to the initial value, the processing unit controls the speaker to output a prompt sound indicating that the motherboard battery malfunctions.

* * * * *